US011313034B2

(12) United States Patent
Zeng et al.

(10) Patent No.: US 11,313,034 B2
(45) Date of Patent: Apr. 26, 2022

(54) METHODS FOR DEPOSITING AMORPHOUS SILICON LAYERS OR SILICON OXYCARBIDE LAYERS VIA PHYSICAL VAPOR DEPOSITION

(71) Applicant: APPLIED MATERIALS, INC., Santa Clara, CA (US)

(72) Inventors: Weimin Zeng, San Jose, CA (US); Yong Cao, San Jose, CA (US); Daniel Lee Diehl, Chiba (JP); Huixiong Dai, San Jose, CA (US); Khoi Phan, San Jose, CA (US); Christopher Ngai, Burlingame, CA (US); Rongjun Wang, Dublin, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 542 days.

(21) Appl. No.: 15/814,497

(22) Filed: Nov. 16, 2017

(65) Prior Publication Data

US 2018/0142343 A1 May 24, 2018

Related U.S. Application Data

(60) Provisional application No. 62/424,323, filed on Nov. 18, 2016.

(51) Int. Cl.
*C23C 14/35* (2006.01)
*H01J 37/34* (2006.01)
(Continued)

(52) U.S. Cl.
CPC .......... *C23C 14/35* (2013.01); *C23C 14/0057* (2013.01); *C23C 14/06* (2013.01);
(Continued)

(58) Field of Classification Search
CPC .. C23C 14/3485; C23C 14/0042; C23C 14/06
See application file for complete search history.

(56) References Cited

U.S. PATENT DOCUMENTS 4,365,012 A  12/1982 Hocker et al.
4,365,013 A * 12/1982 Ishioka .............. G03G 5/08235
                                                     204/192.26
(Continued)

FOREIGN PATENT DOCUMENTS

JP   2004-171904 A   6/2004
KR   2008-0024565 A  3/2008

OTHER PUBLICATIONS

International Search Report and Written Opinion dated Apr. 11, 2018 received for PCT Application No. PCT/US2017/061946.

*Primary Examiner* — Jason Berman
(74) *Attorney, Agent, or Firm* — Moser Taboada

(57) ABSTRACT

In some embodiments, a method of processing a substrate disposed atop a substrate support in a physical vapor deposition process chamber includes: (a) forming a plasma from a process gas within a processing region of the physical vapor deposition chamber, wherein the process gas comprises an inert gas and a hydrogen-containing gas to sputter silicon from a surface of a target within the processing region of the physical vapor deposition chamber; and (b) depositing an amorphous silicon layer atop a first layer on the substrate, wherein adjusting the flow rate of the hydrogen containing gas tunes the optical properties of the deposited amorphous silicon layer.

11 Claims, 9 Drawing Sheets

(51) Int. Cl.
*C23C 14/06* (2006.01)
*C23C 14/00* (2006.01)
*C23C 14/34* (2006.01)
*C23C 14/14* (2006.01)
*C23C 14/22* (2006.01)
*C23C 14/54* (2006.01)
*C23C 14/04* (2006.01)

(52) U.S. Cl.
CPC ............ *C23C 14/14* (2013.01); *C23C 14/228* (2013.01); *C23C 14/3485* (2013.01); *C23C 14/54* (2013.01); *H01J 37/34* (2013.01); *C23C 14/042* (2013.01); *H01J 2237/332* (2013.01)

(56) References Cited

U.S. PATENT DOCUMENTS

| | | |
|---|---|---|
| 5,716,131 A | 2/1998 | Breeding |
| 6,352,910 B1 | 3/2002 | Harshbarger et al. |
| 6,814,814 B2 | 11/2004 | Collins et al. |
| 6,843,881 B2 | 1/2005 | Kim et al. |
| 7,432,201 B2 | 10/2008 | Takehara et al. |
| 7,589,031 B2 | 9/2009 | Anwar et al. |
| 7,763,153 B2 | 7/2010 | Takahashi et al. |
| 8,101,525 B2 | 1/2012 | Shen et al. |
| 8,747,942 B2 | 6/2014 | Nalamasu et al. |
| 9,177,796 B2 | 11/2015 | Bencher et al. |
| 9,478,421 B2 | 10/2016 | Bencher et al. |
| 9,633,839 B2 | 4/2017 | Zeng et al. |
| 9,773,665 B1 | 9/2017 | Zeng et al. |
| 2002/0115269 A1 | 8/2002 | Harshbarger et al. |
| 2008/0020570 A1 | 1/2008 | Naik |
| 2011/0230008 A1 | 9/2011 | Lakshmanan et al. |
| 2011/0284068 A1 | 11/2011 | Moslehi et al. |
| 2011/0299167 A1* | 12/2011 | Woolf .................. C09D 5/004 359/586 |
| 2013/0161629 A1 | 6/2013 | Han et al. |
| 2013/0200386 A1 | 8/2013 | Hutchings et al. |
| 2014/0357065 A1 | 12/2014 | Wang et al. |

* cited by examiner

METHODS FOR DEPOSITING AMORPHOUS SILICON LAYERS OR SILICON OXYCARBIDE LAYERS VIA PHYSICAL VAPOR DEPOSITION

CROSS-REFERENCE TO RELATED APPLICATIONS

This application claims the benefit of U.S. Provisional Patent Application No. 62/424,323, filed with the United States Patent Office on Nov. 18, 2016, which is herein incorporated by reference in its entirety.

FIELD

Embodiments of the present disclosure generally relate to methods for depositing amorphous silicon films and silicon oxycarbide films via physical vapor deposition.

BACKGROUND

The overall size of the integrated circuit components are limited by the smallest geometrical feature that can be etched into the substrate, the critical dimension (CD). Etching features into a substrate uses a variety of materials for different purposes.

For example, amorphous silicon films can used in a variety of semiconductor manufacturing applications, for example as a sacrificial layer in a self-aligned double patterning (SADP) process or a self-aligned quadruple patterning process (SAQP). Typically, such amorphous silicon films may be formed via a chemical vapor deposition (CVD) process. However, the inventors have observed that amorphous silicon films deposited via a chemical vapor deposition (CVD) process can demonstrate bubbling and peeling and little to no optical tunability.

As a further example, silicon-based antireflective coating (Si-ARC) are often used as part of a multi-layer resist, along with for example a photoresist layer, in etching features into a substrate. A silicon-based antireflective coating (Si-ARC) are typically formed via spin-on coating methods. However, silicon-based antireflective coating (Si-ARC) can leave particle residue on underlying layer upon removal.

Accordingly, the inventors have provided improved methods for depositing amorphous silicon films via a physical vapor deposition process and an improved substitute for silicon-based antireflective coating (Si-ARC) in a multi-layer resist.

SUMMARY

Embodiments of the present disclosure include methods for processing a substrate. In some embodiments, a method of processing a substrate includes: a method of processing a substrate disposed atop a substrate support in a physical vapor deposition process chamber includes: (a) forming a plasma from a process gas within a processing region of the physical vapor deposition chamber, wherein the process gas comprises an inert gas and a hydrogen-containing gas to sputter silicon from a surface of a target within the processing region of the physical vapor deposition chamber; and (b) depositing an amorphous silicon layer atop a first layer on the substrate, wherein adjusting the flow rate of the hydrogen containing gas tunes the optical properties of the deposited amorphous silicon layer.

In some embodiments, a method of processing a substrate disposed atop a substrate support in a physical vapor deposition process chamber, includes: (a) forming a plasma from a process gas within a processing region of the physical vapor deposition chamber, wherein the process gas comprises an inert gas and a hydrogen-containing gas to sputter source material from a surface of a target within the processing region of the physical vapor deposition chamber; (b) depositing a layer of one of carbon (C), aluminum oxide (AlOx), aluminum nitride (AlN), aluminum oxynitride (AlON) silicon dioxide ($SiO_2$), silicon nitride (SiN), silicon oxynitride (SiON), silicon oxycarbide (SiOC) or titanium nitride (TiN) atop the substrate wherein adjusting the flow rate of the hydrogen containing gas tunes optical properties, stress, film morphology and surface properties of the deposited layer. In some embodiments, depositing of (b) further includes depositing a layer of one of carbon, metal oxide, aluminum oxide (AlOx), aluminum nitride (AlN), aluminum oxynitride (AlON) silicon dioxide ($SiO_2$), silicon nitride (SiN), silicon oxynitride (SiON), silicon oxycarbide (SiOC), tantalum oxide (TaOx), tin oxide (SnOx), tin silicon oxide (SnSiOx), or titanium nitride (TiN) atop the substrate wherein adjusting a flow rate of the hydrogen containing gas tunes optical properties, stress, film morphology and surface properties of the deposited layer.

In some embodiments, a method of processing a substrate disposed atop a substrate support in a physical vapor deposition chamber, includes: (a) forming a plasma from a process gas within a processing region of the physical vapor deposition chamber, wherein the process gas comprises an inert gas and a carbon monoxide (CO) gas to sputter silicon from a surface of a target within the processing region of the physical vapor deposition chamber; and (b) depositing a silicon oxycarbide (SiOC) layer having a density between 1.67 and 2.3 $g/cm^3$ atop the substrate by tuning at least one of a pressure and a temperature of the physical vapor deposition chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
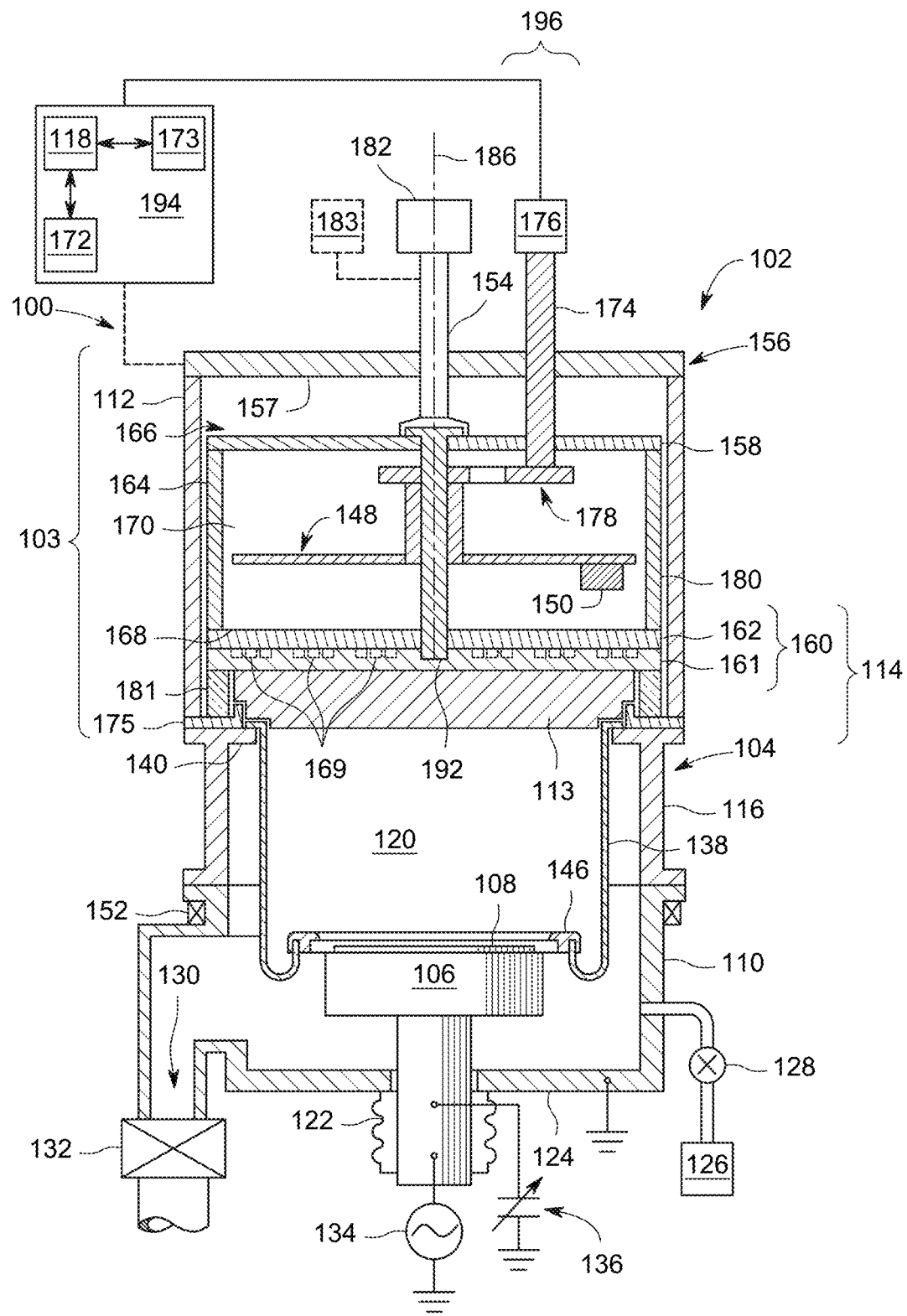
FIG. 1 depicts a schematic cross sectional view of a process chamber used in a method of processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing amorphous silicon layers or films via a physical vapor deposition process. In at least some embodiments, the inventive methods described herein advantageously deposits an amorphous silicon layer without bubbling or peeling of the amorphous silicon layer during subsequent SADP (self-aligned double patterning) or SAQP (self-aligned quadruple patterning) processing. In at least some embodiments, the inventive methods described herein further advantageously provide for tuning the optical properties of the amorphous silicon film. The present disclosure further relates to methods of depositing silicon oxycarbide (SiOC) layers or films via a physical vapor deposition process. In at least some embodiments, the inventive methods described herein further advantageously provide for tuning the density and the optical properties of the silicon oxycarbide (SiOC) layers.

Figure 2:
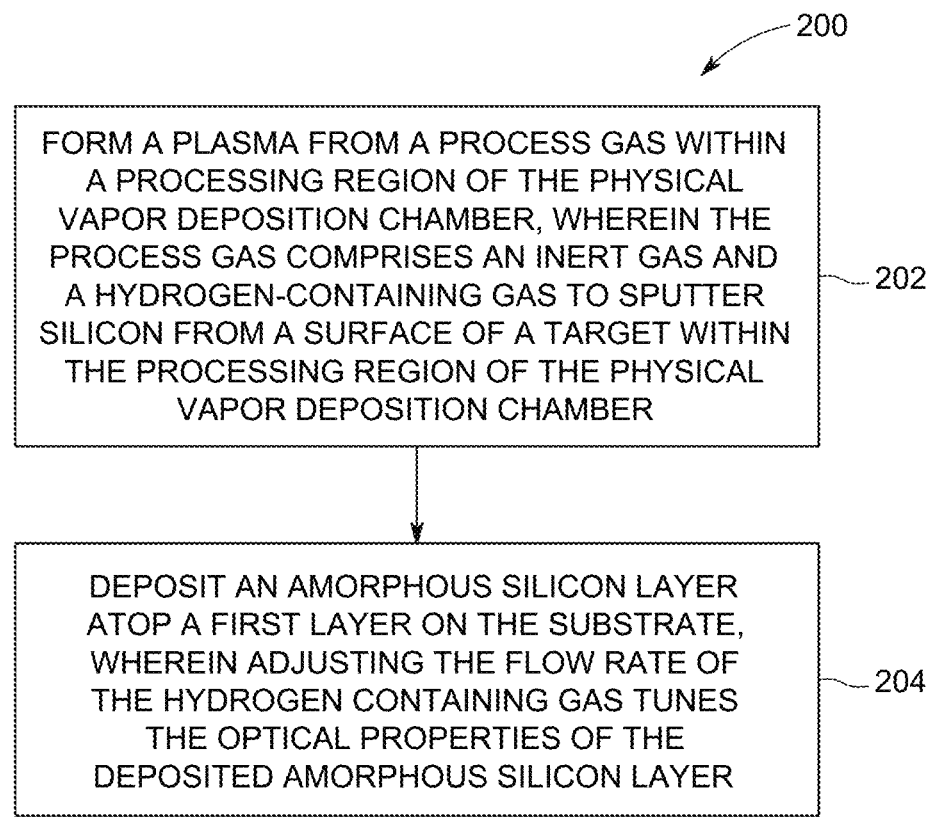
FIG. 2 depicts a flowchart of a method of processing a substrate in accordance with some embodiments of the present disclosure.

FIG. 1 depicts a simplified, cross-sectional view of an illustrative physical vapor deposition (PVD) processing system 100, in accordance with some embodiments of the present disclosure. FIG. 2 depicts a flow chart of a method 200 for depositing amorphous silicon films atop a substrate disposed in a physical vapor deposition process system of the type described in FIG. 1. The method 200 is described below with respect to the stages of processing a substrate as depicted in FIGS. 3A-3I. Examples of PVD chambers suitable for performing the method 200 described herein include the CIRRUS™, AVENIR™ and IMPULSE PVD processing chambers, commercially available from Applied Materials, Inc., of Santa Clara, Calif.

The physical vapor deposition process chamber (process chamber 104) depicted in FIG. 1 comprises a substrate support 106, a target assembly 114 having an optional backing plate assembly 160 and source material 113 which is disposed on a substrate support facing side of the backing plate assembly 160. The process chamber 104 further comprises an RF power source 182 to provide RF energy to the target assembly 114. Additional details relating to the illustrative PVD processing system 100 are discussed below.

The method may be performed on an exemplary substrate 108 disposed within the process chamber 104. The substrate 108 may be any suitable substrate having any suitable geometry, such as a round wafer, square, rectangular, or the like. The substrate 108 may comprise any suitable materials, such as one or more of silicon (Si), silicon oxide ($SiO_2$), silicon nitride (SiN), glass, other dielectric materials, or the like. In some embodiments, the substrate 108 may be a semiconductor wafer (e.g., a 200 mm, 300 mm, or the like silicon wafer). In some embodiments, the substrate 108 may include additional layers, for example a dielectric layer. In some embodiments, the substrate may be a partially fabricated semiconductor device such as Logic, DRAM, or a Flash memory device. In addition, features, such as trenches, vias, or the like, may be formed in one or more layers of the substrate 108.

Figure 3A:
FIGS. 3A-3I depict the stages of processing a substrate in accordance with some embodiments of the present disclosure.

In some embodiments, as depicted in FIG. 3A, the substrate 108 has a first layer 300 disposed atop the substrate 108. In the embodiments, the first layer 300 is directly atop the substrate 108. In some embodiments, the first layer 300 is a dielectric layer such as a tetraethylorthosilicate (TEOS) layer having the formula $Si(OC_2H_5)_4$), or silicon nitride, or silicon oxide.

The method 200 begins at 202 by forming a plasma from a process gas within a processing region 120 of the process chamber 104. In some embodiments, the process gas comprises an inert gas and a hydrogen containing gas. In some embodiments, the process gas consists of, or consists essentially of, an inert gas and a hydrogen containing gas. In some embodiments, the inert gas is a noble gas such as argon, helium, neon or xenon. In some embodiments, the hydrogen containing gas is hydrogen ($H_2$) gas, ammonia ($NH_3$), or a hydrocarbon, such as an alkane having the formula $C_nH_{2n+2}$ (e.g. $CH_4$, $C_2H_6$, $C_3H_8$). In some embodiments, the hydrogen containing gas is one of hydrogen ($H_2$) gas, ammonia ($NH_3$), or a hydrocarbon, such as an alkane having the formula $C_nH_{2n+2}$ (e.g. $CH_4$, $C_2H_6$, $C_3H_5$). In some embodiments, the hydrogen containing gas is hydrogen ($H_2$) gas, ammonia ($NH_3$), a hydrocarbon, such as an alkane having the formula $C_nH_{2n+2}$ (e.g. $CH_4$, $C_2H_6$, $C_3H_8$), and combinations thereof. The hydrogen containing gas is not a compound of hydrogen and a halogen (e.g. HCl, HBr, or HF)

The inert gas is provided to the processing region 120 of the process chamber 104 at a flow rate of about 50 sccm to about 1000 sccm. The hydrogen containing gas is provided to the processing region 120 of the process chamber 104 at a flow rate of about 2 to about 100 sccm. In some embodiments, the process gas comprises about 1% to about 50% hydrogen and the balance inert gas.

The process gas may be formed into a plasma by coupling sufficient energy, from a power source to ignite the process gas described above to form the plasma. The power source may be operable in a continuous wave (CW) or pulsed mode. The power source may include direct current (DC), pulsed DC, or radio frequency (RF) power. In some embodiments, the power source may illustratively provide RF power at about 500 W to about 6 kW of power, for example about 2 kW, at a suitable frequency, such as about 13.56 MHz to form the plasma. In some embodiments, the power source may provide pulsed DC power at a pulse frequency of about 100 to about 250 kHz and at a duty cycle (e.g., the percentage of on time during the total of on time and off time in a given cycle) of about 10% to about 40%.

Figure 3B:
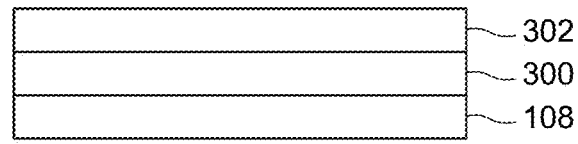

Next at 204, an amorphous silicon layer 302 is deposited atop the first layer 300 on the substrate 108. As used herein, amorphous silicon refers to a non-crystalline form of silicon. In some embodiments, as depicted in FIG. 3B, the amorphous silicon layer 302 is formed directly atop the first layer 300. In some embodiments, the amorphous silicon layer 302 is deposited to a thickness suitable for patterning processes in various semiconductor processes. For example, the amorphous silicon layer 302 can be deposited to a thickness of about 200 to about 550 Angstroms.

The plasma formed in 202 facilitates a sputtering of the source material 113, for example silicon source material, from the target assembly 114, causing a deposition of material on the first layer 300 atop the substrate 108, to form the amorphous silicon layer 302. The inventors have observed that deposition of the amorphous silicon layer 302 via the inventive methods described herein advantageously deposits an amorphous silicon layer 302 that does not bubble or peel during subsequent SADP (self-aligned double patterning) or SAQP (self-aligned quadruple patterning) processing as can be found in a CVD deposited amorphous silicon layer.

Furthermore, the introduction of the hydrogen containing gas to deposit the amorphous silicon layer 302 allows for the tuning of the optical properties of the amorphous silicon layer 302. Specifically, adjusting the flow rate of the hydrogen containing gas tunes or adjusts the k-value of the amorphous silicon layer between about 0.1 and 0.41 and tunes or adjusts the n-value of the amorphous silicon layer between about 4.22 and 3.54. As used herein, the n-value refers to the refractive index of a material and the k-value refers to the extinction coefficient of the material.

Figure 4A:
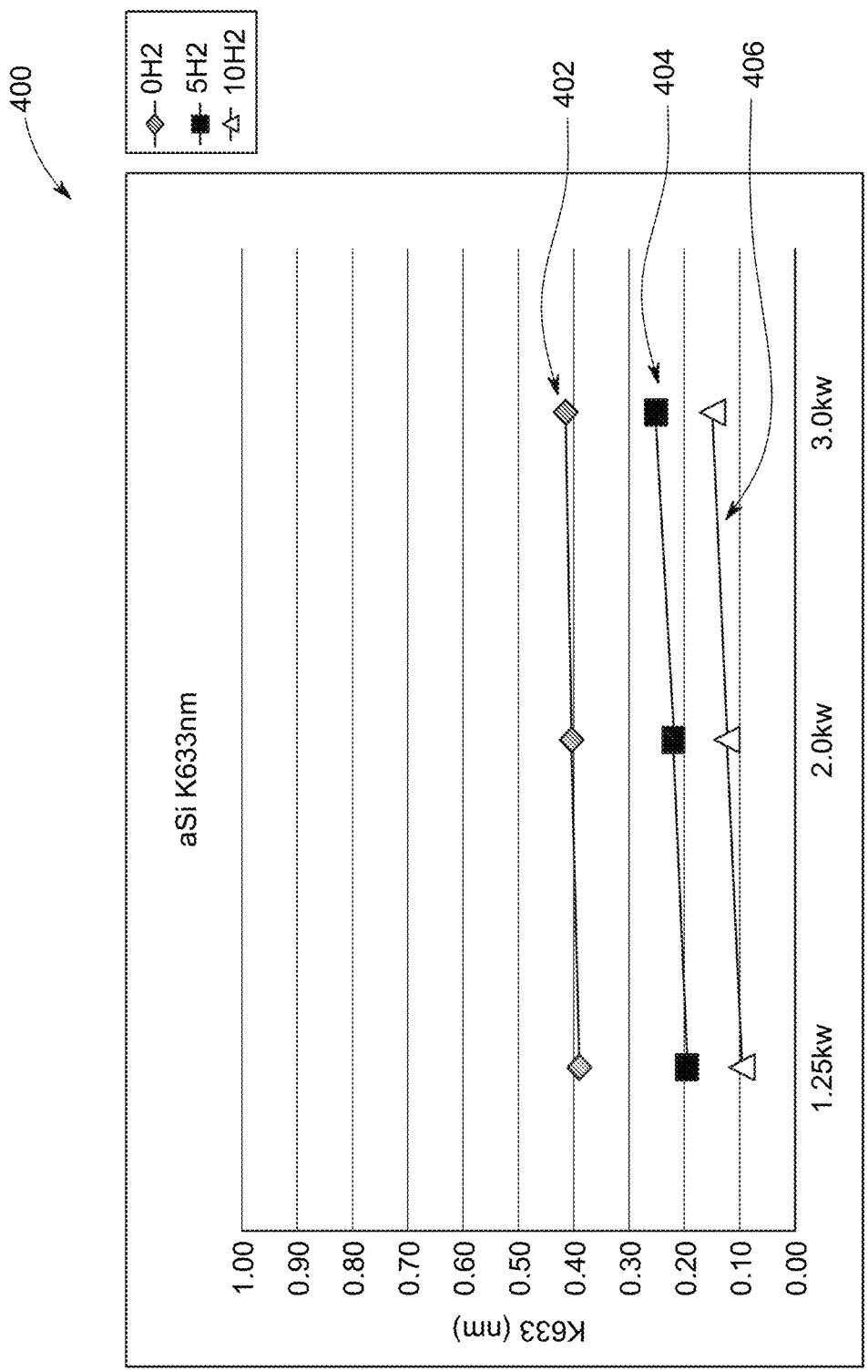
FIGS. 4A-4B depict graphs showing the k-value and n-value of an amorphous silicon layer formed in accordance with some embodiments of the present disclosure.

FIG. 4A depicts a graph 400 showing the k-value of an amorphous silicon layer formed at hydrogen (H2) gas flow rates of 0 sccm $H_2$, 5 sccm $H_2$ and 10 sccm and at varying source power of 1.25 kW, 2 kW, and 3 kW. Line 402 shows the k-value for an amorphous silicon layer formed with a 0 sccm flow rate of $H_2$ gas. Line 404 shows the k-value for an amorphous silicon layer formed with a 5 sccm flow rate of $H_2$ gas. Line 406 shows the k-value for an amorphous silicon layer formed with a 10 sccm flow rate of $H_2$ gas. As seen from graph 400, increasing the flow rate of hydrogen ($H_2$) gas decreases the k-value of the amorphous silicon layer at a constant source power. For example, at a source power of 1.25 kW, the k-value for $H_2$ gas flow rates of 0 sccm, 5 sccm, and 10 sccm are 0.39, 0.19, and 0.09, respectively. Accordingly, increasing the $H_2$ gas flow rate decreases the k-value of the amorphous silicon layer by about 77%. The k-value of the amorphous silicon layer formed with an increasing flow rate of $H_2$ gas at the source power of 2 kW and 3 kW similarly shows a decrease of about 70% and 63% respectively. While keeping the $H_2$ gas flow rate constant and decreasing the source power also shows a decrease in k-value, the magnitude of the decrease is not as pronounced as compared to adjusting the $H_2$ gas flow rate and keeping the source power constant. For example, line 406 shows that keeping the $H_2$ gas flow rate at a constant 10 sccm while reducing the source power from 3 kW to 1.25 kW only reduces the k-value of the amorphous silicon layer by about 40 percent. A person of ordinary skill in the art will recognize that a specific k-value can be obtained through routine experimentation to determine the proper $H_2$ gas flow rate and source power combination.

Figure 4B:
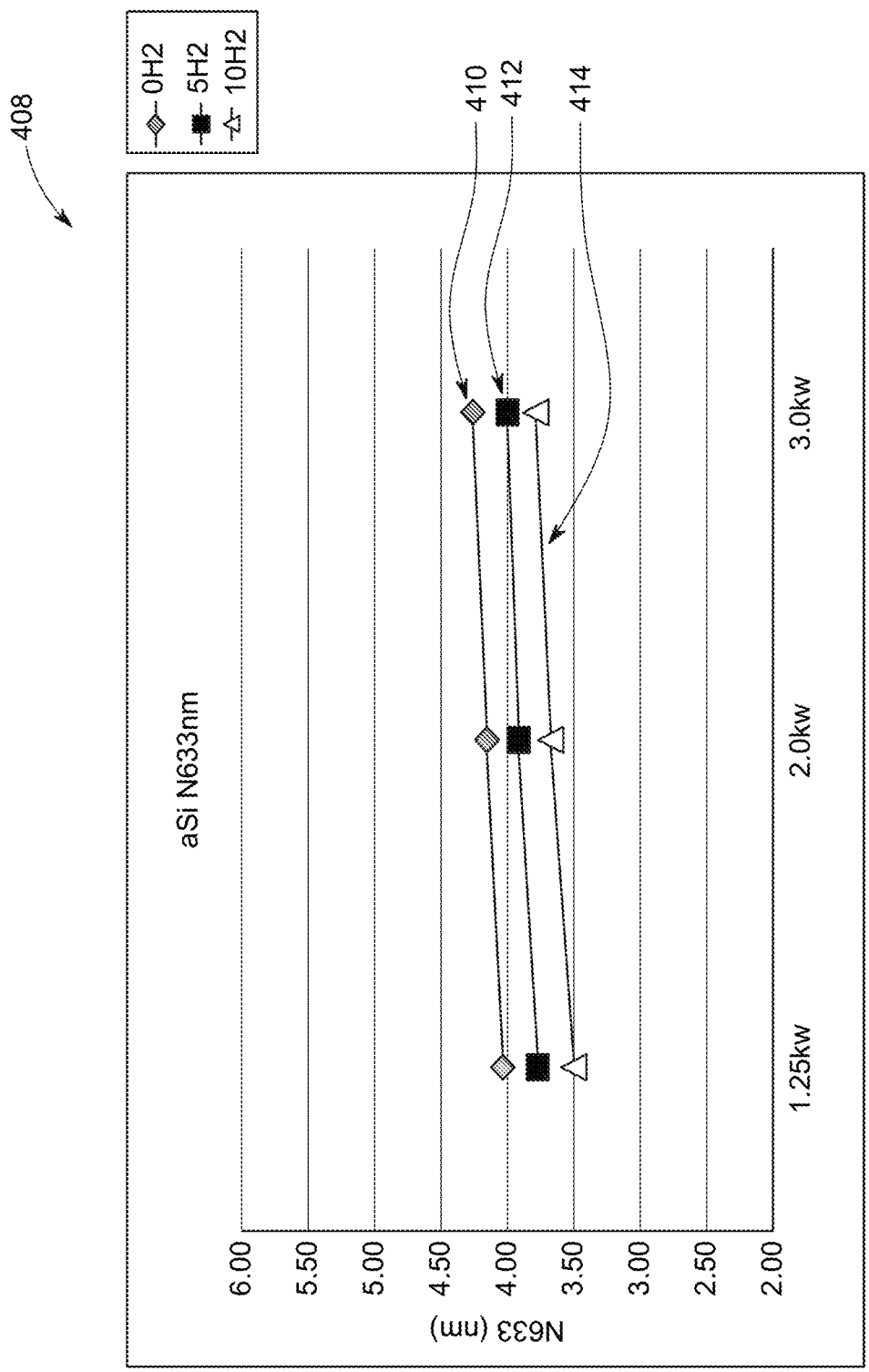

FIG. 4B depicts a graph 408 showing the 2-value of an amorphous silicon layer formed at hydrogen ($H_2$) gas flow rates of 0 sccm H2, 5 sccm H2 and 10 sccm and at a varying source power of 1.25 kW, 2 kW, and 3 kW. Line 410 shows the n-value for an amorphous silicon layer formed with a 0 sccm flow rate of $H_2$ gas. Line 412 shows the n-value for an amorphous silicon layer formed with a 5 sccm flow rate of $H_2$ gas. Line 414 shows the n-value for an amorphous silicon layer formed with a 10 sccm flow rate of $H_2$ gas. As seen from graph 408, increasing the flow rate of hydrogen ($H_2$) gas decreases the n-value of the amorphous silicon layer at a constant source power. For example, at a source power of 1.25 kW, the n-values for $H_2$ gas flow rates of 0 sccm, 5 sccm, and 10 sccm are 4.05, 3.74, and 3.52, respectively. Accordingly, increasing the $H_2$ gas flow rate decreases the n-value of the amorphous silicon layer by about 13%. The n-value of the amorphous silicon layer formed with an increasing flow rate of $H_2$ gas at the source power of 2 kW and 3 kW similarly shows a decrease of about 11% and 9% respectively. While keeping the $H_2$ gas flow rate constant and decreasing the source power also shows a decrease in n-value, the magnitude of the decrease is not as pronounced as compared to adjusting the $H_2$ gas flow rate and keeping the source power constant. For example, line 414 shows that keeping the $H_2$ gas flow rate at a constant 10 sccm while reducing the source power from 3 kW to 1.25 kw only reduces the k-value of the amorphous silicon layer by about 8 percent. A person of ordinary skill in the art will recognize that a specific n-value can be obtained through routine experimentation to determine the proper $H_2$ gas flow rate and source power combination.

Reducing the optical properties (i.e. the n-value and k-value) of the amorphous silicon layer increases the transparency (i.e. the optical property of allowing light to pass through material without scattering) of the amorphous silicon layer, which is beneficial for subsequent lithographic, alignment, and overlay processes. The inventors have also observed that the method 200 can tune or adjust other film properties of the amorphous silicon layer, such as film stress, film morphology (i.e. film crystallinity) and film surface properties (i.e. physical surface properties such as surface roughness and chemical surface properties such as tuning surface bonding sites). For example, the stress of the deposited amorphous silicon layer can be reduced (i.e. brought closer to neutral by depositing the deposited amorphous silicon layer at a process temperature of between about 350 and 400 degrees Celsius.

General processing conditions for depositing the amorphous silicon layer includes maintaining process chamber pressure at about 3 millitorr to about 10 millitorr and maintaining process chamber temperature at about 25 to about 400 degrees Celsius.

In some embodiments, following deposition of the amorphous silicon layer 302 via the method 200 described above, the substrate can undergo further processing, for example a self-aligned double patterning (SADP) process. The self-aligned double patterning (SADP) process described herein is chosen for illustration purpose. The concept of the disclosure is equally applicable to other processes, single or dual patterning scheme, such as via/hole shrink process, self-aligned triple patterning (SATP) process, or self-aligned quadruple patterning (SAQP) process, etc. that may use an amorphous silicon layer in patterning processes in various semiconductor processes such as NAND flash application, DRAM application, or CMOS application.

Figure 3C:
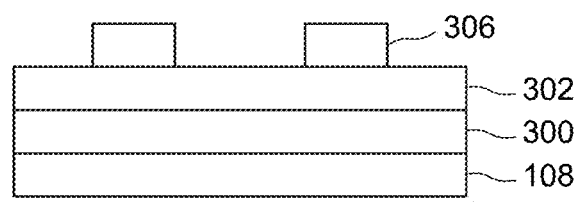

In some embodiments, as depicted in FIG. 3C, a patterned mask layer 306 is formed atop the amorphous silicon layer 302. In some embodiments, the patterned mask layer 306 may be a hard mask layer. The patterned mask layer 306 may comprise any materials suitable to provide a template to facilitate etching features into the underlying amorphous silicon layer 302. For example, in embodiments where the patterned mask layer 306 is a hard mask, the patterned mask layer 306 may comprise at least one of oxides, such as silicon dioxide ($SiO_2$), silicon oxynitride (SiON), silicon oxycarbide (SiOC) or the like, or nitrides, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. In some embodiments, patterned mask layer 306 is a hard mask comprising one or more metal oxides such as tantalum oxide (TaOx), tin oxide (SnOx), tin silicon oxide (SnSiOx), or the like. In some embodiments, the patterned mask layer 306 may comprise an amorphous carbon, such as Advanced Patterning Film (APF), available from Applied Materials, Inc., located in Santa Clara, Calif., or a tri-layer resist (e.g., a photoresist layer, a Si-rich anti-reflective coating (ARC)

layer, and a carbon-rich ARC, or bottom ARC (BARC) layer), a dielectric antireflective coating (DARC), or the like, a spin-on hard mask (SOH), or the like.

Figure 3D:
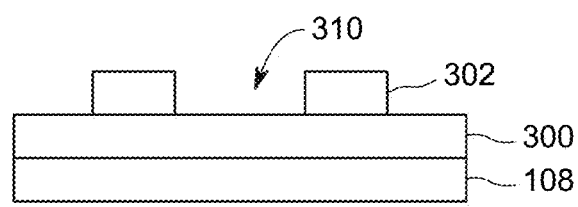

Patterned features 310 formed from the amorphous silicon layer 302 are produced on the first layer 300 using standard photo-lithography and etching techniques, as shown in FIG. 3D. The patterned features 310 are sometimes referred to as placeholders, mandrels or cores and have specific line widths and/or spacing based upon the hard mask material used. After the pattern has been transferred into the amorphous silicon layer 302, any residual photoresist and hard mask material are removed using a suitable photoresist stripping process.

Figure 3E:
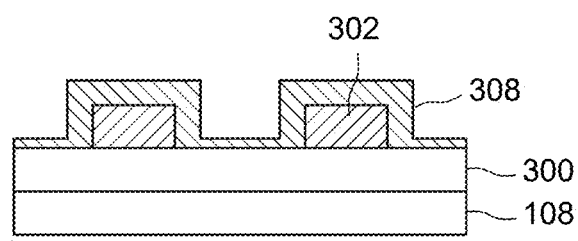
Figure 3F:
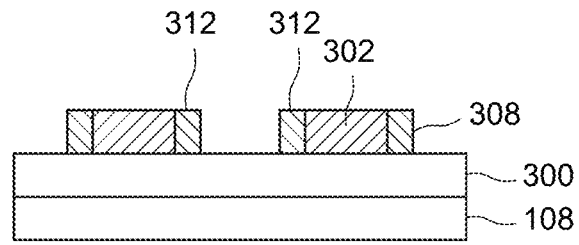
Figure 3G:
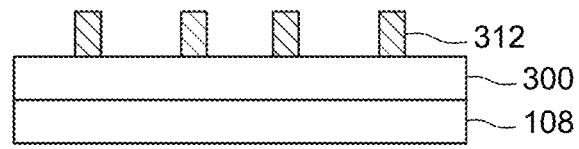
Figure 3H:
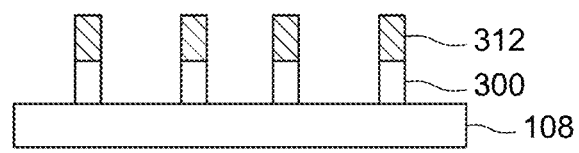
Figure 3I:
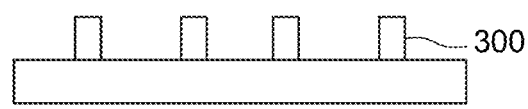

As shown in FIG. 3E, a conformal layer of hard mask material 308 such as silicon oxide or silicon nitride is subsequently deposited over the patterned amorphous silicon 302 mandrels. As shown in FIG. 3F, hard mask spacers 312 are then formed on the sides of the patterned amorphous silicon 302 mandrels by preferentially etching the hard mask material 308 from horizontal surfaces with an anisotropic plasma etch to open the hard mask material 308 deposited on top of the patterned amorphous silicon 302 mandrels as well as remove the hard mask material 308 deposited at the bottom between the two sidewalls of the patterned amorphous silicon 302 mandrels. As shown in FIG. 3G, the patterned amorphous silicon 302 mandrels may then be removed, leaving behind hard mask spacers 312. As shown in FIG. 3H, the hard mask spacers 312 may be used as an etch mask for transferring the pattern to the first layer 300. The hard mask spacers 312 are subsequently removed as shown in FIG. 3I. Therefore, the density of the pattern formed in the first layer 300 is twice that of the photo-lithographically patterned amorphous silicon 302 mandrels, and the pitch of the pattern formed in the first layer 300 is half the pitch of the photo-lithographically patterned amorphous silicon 302 mandrels.

The method 200 is described above with respect to an amorphous silicon layer. However, the method 200 can also be used to deposit materials other than amorphous silicon, such as carbon, metal oxide, aluminum oxide (AlOx), aluminum nitride (AlN), aluminum oxynitride (AlON) silicon dioxide ($SiO_2$), silicon nitride (SiN), silicon oxynitride (SiON), silicon oxycarbide (SiOC) or titanium nitride (TiN). Non-limiting examples of suitable metal oxides for deposition include tantalum oxide (TaOx), tin oxide (SnOx), tin silicon oxide (SnSiOx), and combinations thereof. Further, a plasma from a process gas can be formed within a processing region of the physical vapor deposition chamber. The process gas comprises an inert gas and a hydrogen-containing gas to sputter source material from a surface of a target within the processing region of the physical vapor deposition chamber. The process gas can also comprise oxygen and/or nitrogen depending on the material to be deposited. However, similar to the amorphous silicon layer described above, tuning or adjusting the flow rate of the hydrogen containing gas allows for tuning the optical properties, stress, film morphology and surface properties of the particular deposited material.

Figure 5:
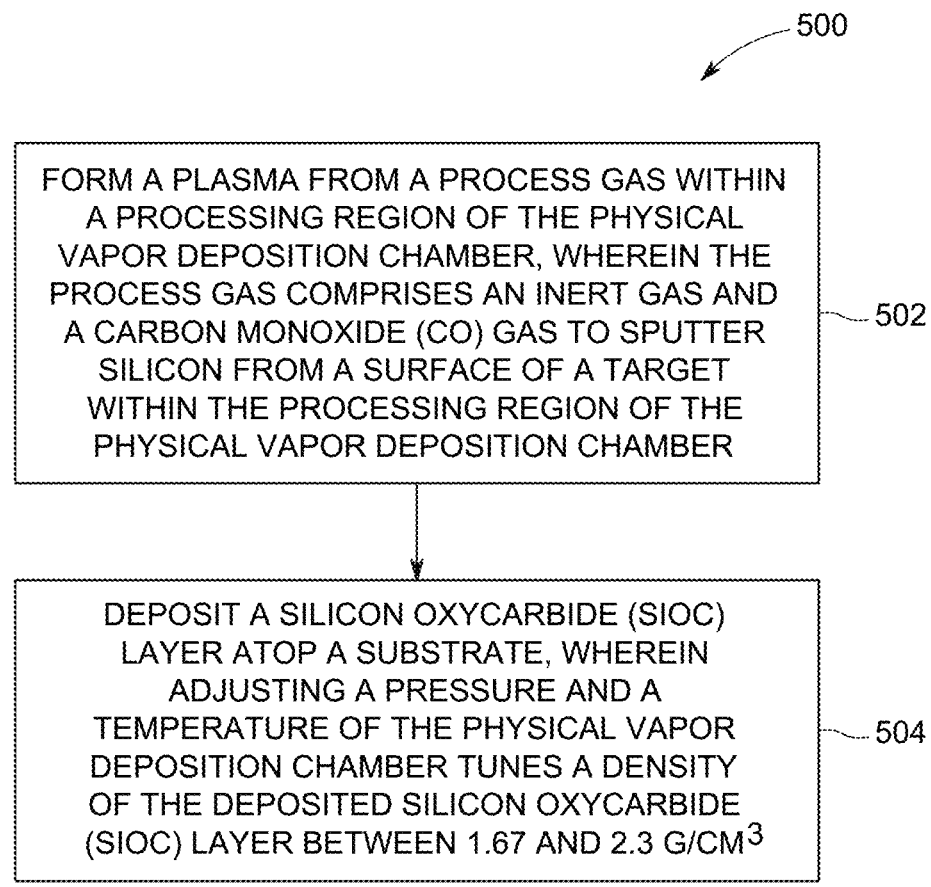
FIG. 5 depicts a flow chart of a method for depositing a silicon oxycarbide (SiOC) layer atop a substrate disposed in a physical vapor deposition process system in accordance with some embodiments of the present disclosure.

FIG. 5 depicts a flow chart of a method 500 for depositing a silicon oxycarbide (SiOC) layer atop a substrate disposed in a physical vapor deposition process system of the type described in FIG. 1. Examples of PVD chambers suitable for performing the method 200 described herein include the CIRRUS™, AVENIR™ and IMPULSE PVD processing chambers, commercially available from Applied Materials, Inc., of Santa Clara, Calif.

The method may be performed on an exemplary substrate 108 disposed within the process chamber 104. The substrate 108 may be any suitable substrate having any suitable geometry, such as a round wafer, square, rectangular, or the like. The substrate 108 may comprise any suitable materials, such as one or more of silicon (Si), silicon oxide (SiO2), silicon nitride (SiN), glass, other dielectric materials, or the like. In some embodiments, the substrate 108 may be a semiconductor wafer (e.g., a 200 mm, 300 mm, or the like silicon wafer). In some embodiments, the substrate 108 may include additional layers, for example a dielectric layer. In some embodiments, the substrate may be a partially fabricated semiconductor device such as Logic, DRAM, or a Flash memory device. In addition, features, such as trenches, vias, or the like, may be formed in one or more layers of the substrate 108.

The method 500 begins at 502 by forming a plasma from a process gas within a processing region of the physical vapor deposition chamber. The process gas comprises an inert gas and a carbon monoxide (CO) gas or carbon dioxide ($CO_2$) gas. In some embodiments, the process gas consists of, or consists essentially of, an inert gas and a carbon monoxide (CO) gas or carbon dioxide ($CO_2$) gas. In some embodiments, the inert gas is a noble gas such as argon, helium, neon or xenon.

In some embodiments, the process gas comprises inert gas, a carbon monoxide (CO) gas or carbon dioxide ($CO_2$) gas, and oxygen ($O_2$) gas. In some embodiments, the process gas consists of, or consists essentially of, an inert gas, a carbon monoxide (CO) gas or carbon dioxide ($CO_2$) gas, and oxygen ($O_2$) gas. The flow rate of the oxygen ($O_2$) gas in relation to the flow rate of the carbon monoxide (CO) gas or carbon dioxide ($CO_2$) gas tunes or adjusts the optical properties (n-value and k-value) of the silicon oxycarbide (SiOC) layer. In addition, as discussed below the application of bias power in conjunction with the flow rate of oxygen ($O_2$) gas impacts film stress.

The process gas may be formed into a plasma by coupling sufficient energy from a power source to ignite the process gas described above to form the plasma. The power source may be operable in a continuous wave (CW) or pulsed mode. The power source may include direct current (DC), pulsed DC, or radio frequency (RF) power. In some embodiments, the power source may illustratively provide RF power at about 500 W to about 6 kW of power, for example about 2 kW, at a suitable frequency, such as about 13.56 MHz to form the plasma. In some embodiments, the power source may provide pulsed DC power at a pulse frequency of about 100 to about 250 kHz and at a duty cycle (e.g., the percentage of on time during the total of on time and off time in a given cycle) of about 10% to about 40%.

The inert gas is provided to the processing region 120 of the process chamber 104 at a flow rate of about 10 sccm to about 200 sccm. The carbon monoxide (CO) gas or carbon dioxide ($CO_2$) gas is provided to the processing region 120 of the process chamber 104 at a flow rate of about 10 to about 200 sccm. The oxygen ($O_2$) gas is provided to the processing region 120 of the process chamber 104 at a flow rate of about 0 to about 200 sccm. The ratio of the flow rate of inert gas to the flow rate of the carbon monoxide (CO) gas or carbon dioxide ($CO_2$) gas is 1:1. The ratio of the flow rate of the carbon monoxide (CO) gas or carbon dioxide ($CO_2$) gas to the oxygen ($O_2$) gas is 1:0 to 1:1.

Figure 6:
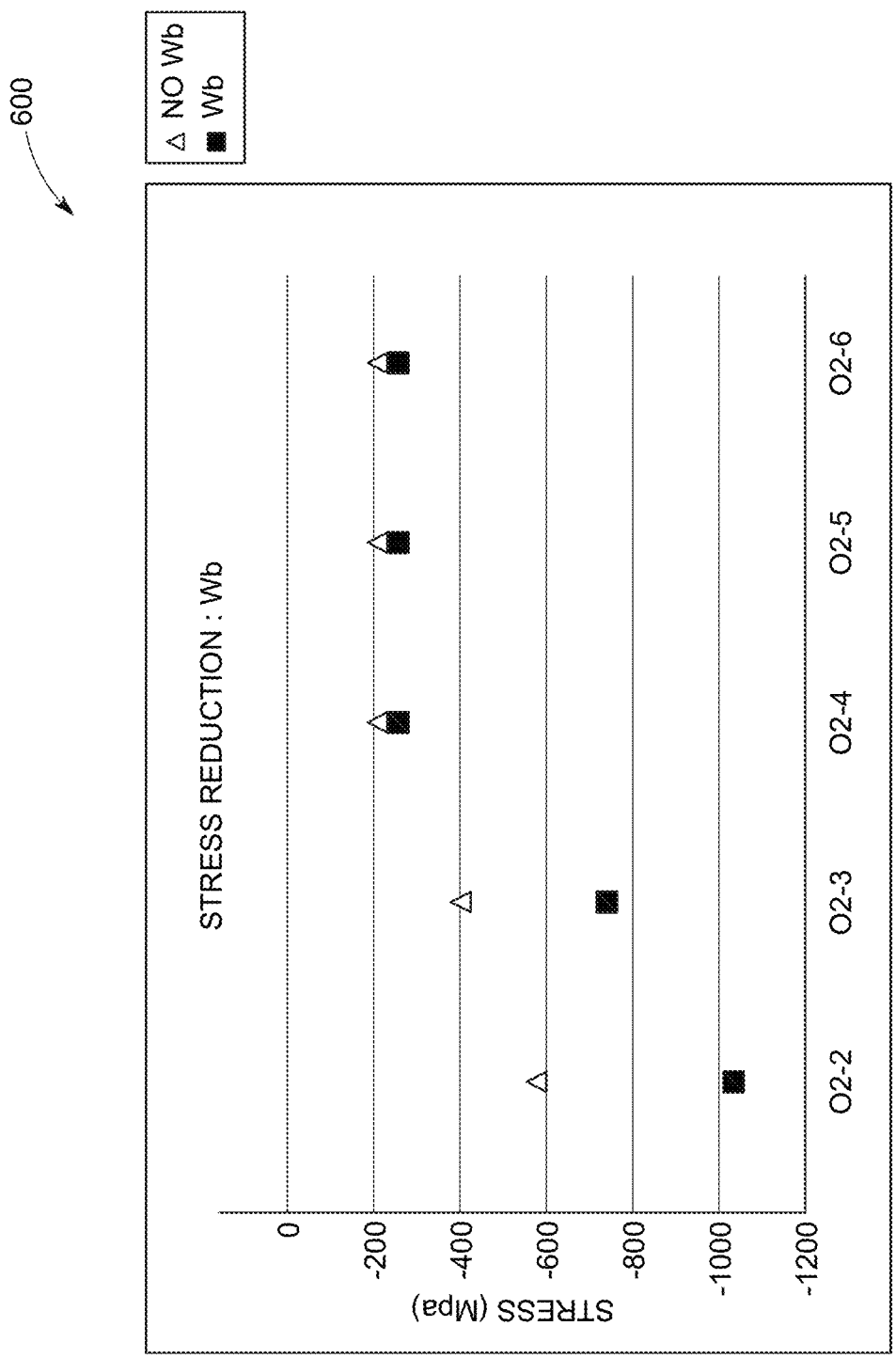
FIG. 6 depicts a graph of the film stress for a silicon oxycarbide (SiOC) layer formed with bias and without bias at varying oxygen ($O_2$) flow rates in accordance with some embodiments of the present disclosure.

In some embodiments, a bias power may be applied to the substrate 108 to facilitate directing ions from the plasma towards the substrate 108 and reducing surface roughness of the silicon oxycarbide (SiOC) layer from about 10 angstroms without bias to less than about 2 angstroms with bias. For example, in some embodiments, the bias power may be about 100 to about 1000 watts. FIG. 6 shows a graph 600 of the film stress for a film formed with bias and without bias at varying oxygen ($O_2$) flow rates. At low oxygen ($O_2$) flow rates of 20 sccm (labeled O2-2 on the graph 600) and 30 sccm (labeled O2-3 on the graph 600), there is a significant difference in film stress for films formed with and without bias. However, higher oxygen ($O_2$) flow rates of 30 sccm to 60 sccm show minor impact of bias on film stress. FIG. 1, shows a bias power source 134, which may be an RF bias power source coupled to the substrate support 106 in order to form the plasma within the processing region 120.

Next at 504, the silicon oxycarbide (SiOC) layer is deposited atop the substrate 108. In some embodiments, the silicon oxycarbide (SiOC) layer is formed atop one or more additional layers atop the substrate 108. In some embodiments, the silicon oxycarbide (SiOC) layer is deposited to a thickness suitable for patterning processes in various semiconductor processes. For example, the silicon oxycarbide (SiOC) layer can be deposited to a thickness of about 50 to about 500 angstroms.

The pressure within the processing region 120 of the process chamber 104 during deposition of the silicon oxycarbide (SiOC) layer is about 3 milliTorr to about 20 milliTorr. The temperature within the processing region 120 of the process chamber 104 during deposition of the silicon oxycarbide (SiOC) layer is about 25 to about 375 degrees Celsius. By adjusting the temperature and pressure within the processing region 120 the inventors have observed that the density of the deposited silicon oxycarbide (SiOC) layer can be tuned between 1.67 and 2.3 g/cm$^3$. The inventors have observed that increasing the pressure within the processing region 120 decreases the density of the deposited silicon oxycarbide (SiOC) layer while increasing the temperature within the processing region 120 increases the density of the deposited silicon oxycarbide (SiOC) layer. The density of the deposited silicon oxycarbide (SiOC) layer impacts the etch rate of the silicon oxycarbide (SiOC) layer. A lower etch rate equates to a higher etch selectivity and a higher etch rate equates to a lower etch selectivity.

Figure 7:
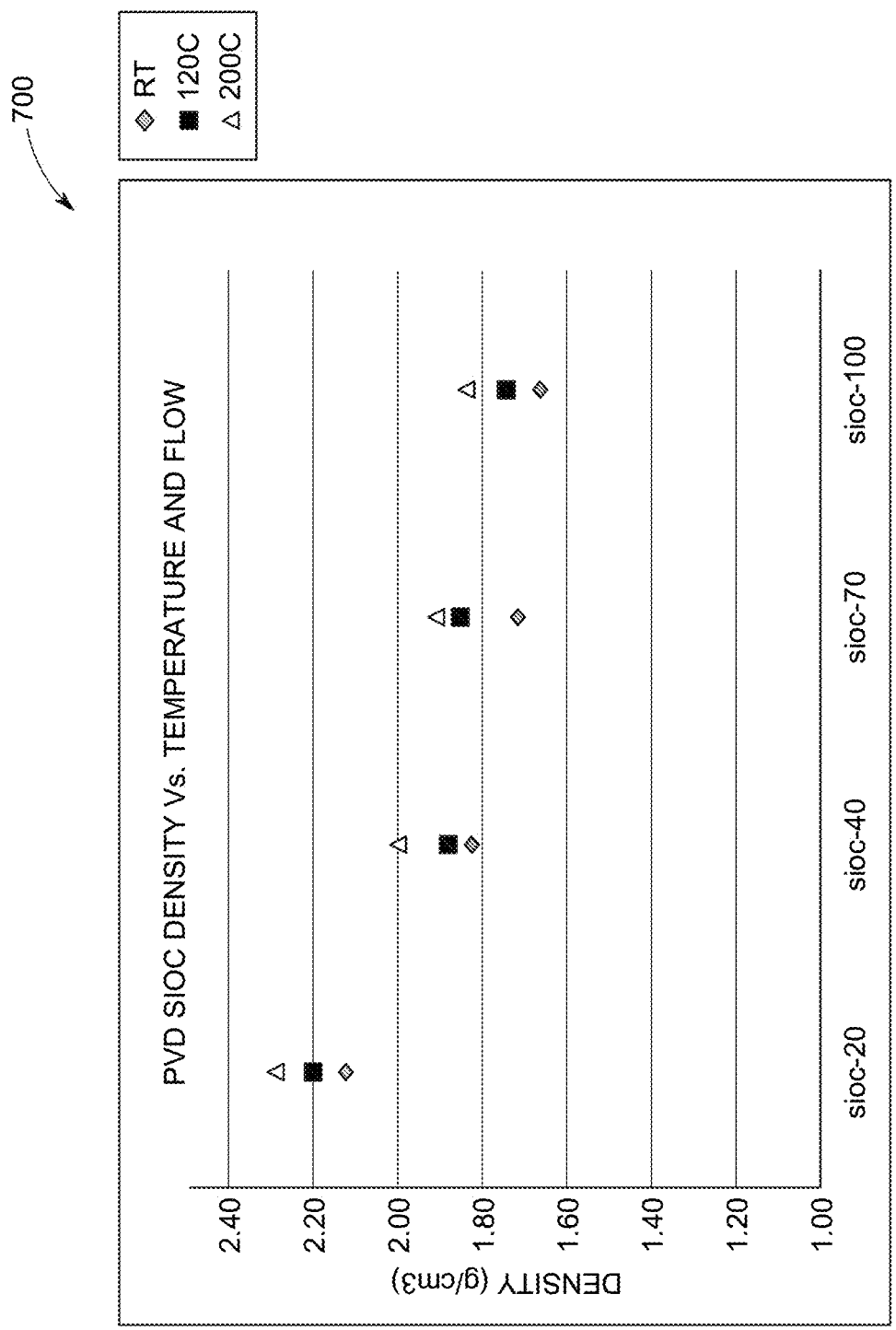
FIG. 7 depicts a graph of the density of a silicon oxycarbide (SiOC) layer formed at varying process temperatures and carbon monoxide (CO) flow rates in accordance with some embodiments of the present disclosure.

FIG. 7 shows graph 700, wherein a silicon oxycarbide (SiOC) layer is deposited at room temperature (RT), e.g. 25 degrees Celsius, at 120 degrees Celsius, and at 200 degrees Celsius and at a carbon monoxide gas flow rate of 20 sccm (SiOC-20), 40 sccm (SiOC-40), 70 sccm (SiOC-70), and 100 sccm (SiOC-100). The graph 700 also shows that at a constant carbon monoxide gas flow rate the density of the deposited silicon oxycarbide (SiOC) layer decreases as the temperature increases.

In addition to tuning the density of the deposited silicon oxycarbide (SiOC) layer, the inventors have observed that the optical properties of the silicon oxycarbide (SiOC) layer can be tuned to provide optical properties similar to an Si-ARC layer by adjusting the flow rate of carbon monoxide (CO) gas to the flow rate of oxygen ($O_2$) gas. The n-value and k-value of a Si-ARC layer is 1.72 and 0.25 respectively. Table 1 shows how the flow rate of carbon monoxide (CO) gas relative to the flow rate of oxygen ($O_2$) gas impacts the n-value and k-value of the silicon oxycarbide (SiOC) layer. For example, row 2 shows that a silicon oxycarbide (SiOC) layer formed with a flow rate of 40 sccm of carbon monoxide (CO) gas relative to 20 sccm of oxygen ($O_2$) gas has a n-value of 1.86 and a k-value of 0.647. As shown in row 2 of Table 1, increasing the flow rate of the oxygen ($O_2$) gas relative to the carbon monoxide (CO) gas decreases the n-value and k-value of the silicon oxycarbide (SiOC) layer, and can provide optical properties similar to the Si-ARC layer. The silicon oxycarbide (SiOC) layer discussed in table 1 was formed at 50 degrees Celsius, with 3 kW of source power, 200 watts of bias power, gate open (GO) pressure and 40 sccm of argon.

TABLE 1

| Condition | DR (A/s) | Thk (A) | N193 | K193 | GOF |
|---|---|---|---|---|---|
| 1 | 40-20 | 13.3 | 665 | 1.86 | 0.647 | 0.88 |
| 2 | 40-30 | 13.7 | 685 | 1.72 | 0.212 | 0.97 |
| 3 | 40-40 | 6.4 | 321 | 1.60 | 0.000 | 0.99 |
| 4 | 40-50 | 5.8 | 291 | 1.60 | 0.001 | 0.99 |
| 5 | 40-60 | 5.6 | 278 | 1.60 | 0.004 | 0.99 |

The silicon oxycarbide (SiOC) layer described in method 500 above advantageously replaces a Si-ARC layer as part of a multi-layer resist, while having similar optical properties and a tunable density and without leave particle residue on underlying layer upon removal. In some embodiments, following formation of the silicon oxycarbide (SiOC) layer, a photoresist layer is formed atop the silicon oxycarbide (SiOC) layer. The photoresist layer and the silicon oxycarbide (SiOC) layer form a multi-layer resist suitable for etching a pattern into any suitable semiconductor manufacturing process material layer underlying the multi-layer resist.

The method 500 is described above with respect to an silicon oxycarbide (SiOC) layer. However, the method 500 can also be used to deposit materials other than silicon oxycarbide (SiOC) layer, such as aluminum oxynitride (AlON) or aluminum oxycarbon nitride (AlONC) with similar density and optical property tunability.

Returning to FIG. 1, a second energy source 183, optionally coupled to the target assembly 114, may provide DC power to the target assembly 114 to direct the plasma towards the target assembly 114. In some embodiments, the DC power may range from about 200 W to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the source material 113 and increased sputtering of metal atoms from the target assembly 114.

The PVD processing system 100 includes a chamber lid 102 removably disposed atop a process chamber 104. The chamber lid 102 may include the target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly. The magnetron assembly provides a rotating magnetic field proximate the target assembly 114 to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104.

The gas source 126 may be a gas box providing the gases used in the methods described above via one or more gas lines coupled to the process chamber 104. For example, a first gas line may be provided from the gas source 126 to the process chamber 104 to provide hydrogen ($H_2$) to the process chamber 104. A second gas line may be provided from the gas source 126 to the process chamber 104 to provide one or more of oxygen ($O_2$), nitrogen ($N_2$), carbon monoxide (CO) or argon (Ar) to the process chamber 104. A third gas line may be provided from the gas source 126 to the process chamber 104 to provide a backside gas (such as a mixture of argon and hydrogen or other suitable backside gas) to the substrate support 106.

An exhaust port 130 may be provided and coupled to a pump (not shown) via a valve 132 for exhausting the interior of the process chamber 104 and to facilitate maintaining a suitable pressure inside the process chamber 104.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113, such as a metal, metal oxide, metal alloy, or the like, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source or a pulsed DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

The PVD processing system 100 further comprises a substrate support impedance circuit, such as auto capacitance tuner 136, coupled to the substrate support 106 for adjusting voltage on the substrate 108. For example, the auto capacitance tuner 136 may be used to control the voltage on the substrate 108, and thus, the substrate current (e.g., ion energy at the substrate level).

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein, such as the method 200, may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to particular embodiments of the present disclosure, other and further embodiments of the disclosure may be devised without departing from the basic scope of the disclosure.

The invention claimed is:

1. A method of processing a substrate disposed atop a substrate support in a physical vapor deposition chamber, comprising:
    forming a plasma from a process gas within a processing region of the physical vapor deposition chamber, wherein the process gas comprises an inert gas and a hydrogen containing gas to sputter silicon from a surface of a target within the processing region of the physical vapor deposition chamber; and
    depositing an amorphous silicon layer atop a first layer on the substrate, wherein a flow rate of a hydrogen containing gas at a constant source power tunes the optical properties of the deposited amorphous silicon layer, wherein the hydrogen containing gas has a flow rate of approximately 2 sccm to approximately 100 sccm, wherein the constant source power is approximately 1 kilowatts to approximately 3 kilowatts, and wherein the optical properties of the deposited amorphous silicon layer include
    a refractive index (n-value) or an extinction coefficient (k-value) that determines an optical transparency of the amorphous silicon layer.

2. The method of claim 1, wherein the extinction coefficient (k-value) of the amorphous silicon layer is between about 0.1 and 0.41.

3. The method of claim 1, wherein the refractive index (n-value) of the amorphous silicon layer is between about 4.22 and 3.54.

4. The method of claim 1, wherein the process gas consists of the inert gas and the hydrogen containing gas.

5. The method of claim 1, wherein the process gas consists essentially of the inert gas and the hydrogen containing gas.

6. The method of claim 1, wherein the inert gas is provided at a flow rate of about 50 to about 1000 sccm.

7. The method of claim 1, wherein the hydrogen containing gas is one of hydrogen ($H_2$) gas, ammonia ($NH_3$), or an alkane having a formula $C_nH_{2n+2}$.

8. The method of claim 1, wherein a pressure in the processing region of the physical vapor deposition chamber during deposition of the amorphous silicon layer is about 3 to about 10 millitorr.

9. The method of claim 1, wherein a temperature in the processing region of the physical vapor deposition chamber during deposition of the amorphous silicon layer is about 25 to about 400 degrees Celsius.

10. The method of claim 1, wherein forming a plasma from a process gas further comprises applying a source power from a power source to the physical vapor deposition chamber to ignite the process gas.

11. The method of claim 10, wherein the power source provides pulsed DC power at a pulse frequency of about 100 to about 250 kHz and at a duty cycle of about 10% to about 40%.

* * * * *